United States Patent [19]
Li et al.

[11] Patent Number: 6,159,754
[45] Date of Patent: *Dec. 12, 2000

[54] METHOD OF MAKING A CIRCUIT EDIT INTERCONNECT STRUCTURE THROUGH THE BACKSIDE OF AN INTEGRATED CIRCUIT DIE

[75] Inventors: Jian Li, Sunnyvale; Paul Winer; Adam J. DeGrush, both of Santa Clara; Steven P. Maher, Campbell, all of Calif.

[73] Assignee: Intel Corporation, Santa Clara, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 09/074,577

[22] Filed: May 7, 1998

[51] Int. Cl.$^7$ ................................................. H01L 21/00
[52] U.S. Cl. .................................. 438/4; 438/8; 438/14; 438/118; 438/690
[58] Field of Search ........................... 438/4, 8, 14, 118, 438/690, 977; 216/59, 62, 63, 65

[56] References Cited

U.S. PATENT DOCUMENTS

| | | | |
|---|---|---|---|
| 4,632,724 | 12/1986 | Chesebro et al. | 156/626 |
| 4,650,744 | 3/1987 | Amano | 430/313 |
| 4,732,646 | 3/1988 | Elsner et al. | 156/626 |
| 4,759,958 | 7/1988 | Numata et al. | 427/255 |
| 4,961,812 | 10/1990 | Baerg et al. | 156/345 |
| 4,980,019 | 12/1990 | Baerg et al. | 156/643 |
| 5,037,771 | 8/1991 | Lipp | 438/200 |
| 5,064,498 | 11/1991 | Miller | 156/626 |
| 5,208,178 | 5/1993 | Usami | 438/200 |
| 5,268,065 | 12/1993 | Grupen-Shemansky | 156/630 |
| 5,438,166 | 8/1995 | Carey et al. | 174/261 |
| 5,701,666 | 12/1997 | Dehaven et al. | 29/831 |
| 5,838,625 | 11/1998 | Cutter et al. | 365/225.7 |
| 5,840,627 | 11/1998 | Huggins | 438/669 |
| 5,843,844 | 12/1998 | Miyanaga | 438/694 |
| 5,844,295 | 12/1998 | Tsukude et al. | 257/529 |
| 5,904,486 | 5/1999 | Livengood et al. | 438/4 |

FOREIGN PATENT DOCUMENTS

| | | | |
|---|---|---|---|
| 0 295 065 | 12/1988 | European Pat. Off. | 156/627.1 |
| 56-46534 | 4/1981 | Japan | 156/626.1 |
| 59-44827 | 3/1984 | Japan | 156/626.1 |
| 1-119037 | 5/1989 | Japan | 156/627.1 |

OTHER PUBLICATIONS

Paul Winer, "IC Failure Analysis, E–Beam Tutorial," International Reliability and Physics Symposium, 1996.

Scott Silverman, "Laser Microchemical Technology Enables Real–Time Editing of First–Run Silicon," Solid State Technology, 1996.

Ann N. Campbell, Fault Localization with the Focused Ion Beam (FIB) System, ISTFA 96' Workshops.

Vladimir Liberman, Vincent Malba, and Anthony F. Bernhart, "Integration of Vapor Deposited Polymide into a Multichip Module Packaging Process", IEEE Transaction On Components, Packaging, and Manufacturing Technology–Part B, vol. 20, No. 1, Feb. 1997.

*Primary Examiner*—John Guay
*Assistant Examiner*—Alonzo Chambliss
*Attorney, Agent, or Firm*—Blakely, Sokoloff, Taylor & Zafman LLP

[57] ABSTRACT

A method of making circuit edit structures through the backside of a flip-chip packaged integrated circuit die. In one embodiment, a circuit edit is achieved by exposing first and second circuit edit connection targets through a semiconductor substrate of the integrated circuit die from the backside. Next, a polyimide layer is vapor deposited over the first and second circuit edit connection targets and the exposed semiconductor substrate. Next, the circuit edit connection targets are re-exposed through the polyimide layer and a conductor is deposited over the re-exposed circuit edit connection targets and the deposited polyimide layer from the backside of the integrated circuit to couple together the circuit edit connection targets. The polyimide layer may act as both an insulation layer and an antireflective coating layer.

25 Claims, 11 Drawing Sheets

FIG. 3

METHOD OF MAKING A CIRCUIT EDIT INTERCONNECT STRUCTURE THROUGH THE BACKSIDE OF AN INTEGRATED CIRCUIT DIE

RELATED APPLICATIONS

This application is related to U.S. Pat. No. 5,904,486, issued May 18, 1999 from application Ser. No. 08/940,624, filed Sep. 30, 1997, entitled "A METHOD AND APPARATUS FOR PERFORMING A CIRCUIT EDIT THROUGH THE BACK SIDE OF AN INTEGRATED CIRCUIT DIE."

FIELD OF THE INVENTION

The present invention relates generally to the field of integrated circuit testing and, more particularly, to a method and an apparatus for performing circuit edits in an integrated circuit for the purpose of verifying design engineering change orders.

BACKGROUND INFORMATION

Once a newly designed integrated circuit has been formed on a semiconductor substrate, the integrated circuit must be thoroughly tested to ensure that the circuit performs as designed. Portions of the integrated circuit that do not function properly are identified so that they can be fixed by correcting the design of the integrated circuit. This process of testing an integrated circuit to identify problems with its design is known as debugging. After debugging the integrated circuit and correcting any problems with its design, the final fully functional integrated circuit designs are used to mass produce the integrated circuits in a manufacturing environment for consumer use.

Figure 1A:
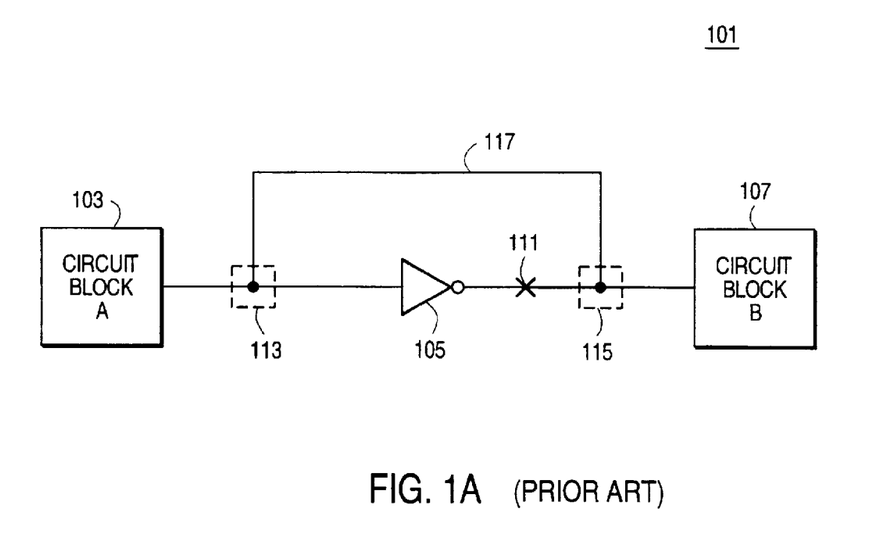
FIG. 1A is a schematic showing a prior art circuit edit performed on an integrated circuit.

During the debugging process, it is sometimes necessary to add, delete or reroute signal line connections within the integrated circuit. For instance, assume that FIG. 1A shows an integrated circuit 101 that requires edits to be made. In this example, circuit block A 103 is coupled to circuit block B 107 through inverter 105. If it is determined during the debug process that the signal from circuit block A 103 should not be inverted when received by circuit block B 107, integrated circuit 101 may be edited in a way such that inverter 105 is effectively removed from integrated circuit 101 and that circuit block A 103 is directly connected to circuit block B 107.

Using prior art techniques, integrated circuit 101 may be edited as follows. Inverter 105 may be disconnected from circuit block A 103 and circuit block B 107 by physically cutting the signal line through the front side of the integrated circuit die as shown in FIG. 1A with cut 111. After cut 111 is made, circuit block A 103 is no longer connected to circuit block B 107 through inverter 105. In order to reconnect circuit block A 103 and circuit block B 107, dielectric is removed from the front side of the integrated circuit die at locations 113 and 115 to expose the buried metal of the signal line connected to circuit block A 103 and circuit block B 107. After the dielectric is removed from the signal line at locations 113 and 115, a new metal line 117 is deposited over the dielectric on the front side of the integrated circuit die and over the exposed pieces of metal at locations 113 and 115 to directly connect circuit block A 103 to circuit block B 107.

Figure 1B:
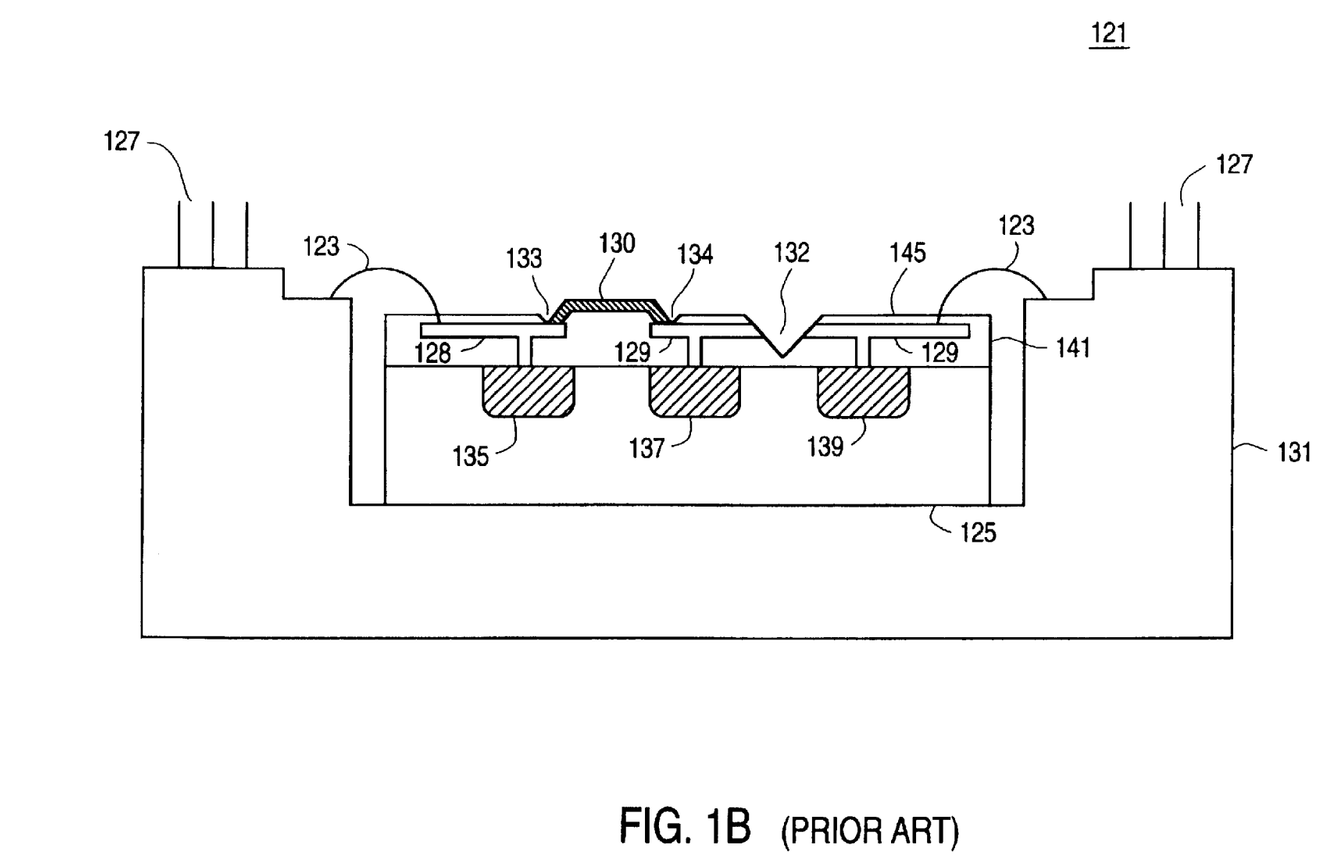
FIG. 1B is an illustration of a cross-section of a prior art wire bond packaged integrated circuit die showing a circuit edit performed on an integrated circuit.

FIG. 1B is an illustration of a cross-section of an integrated circuit package 121 including an integrated circuit die 125 on which circuit edits have been performed. As shown in FIG. 1B, integrated circuit package 121 includes wire bonds 123 disposed along the periphery of integrated circuit die 125 to electrically connect integrated circuit connections through metal interconnects 128 and 129 to pins 127 of the package substrate 131. Metal interconnects 128 and 129 are disposed in a dielectric isolation layer 141 of integrated circuit die 125, and are coupled to diffusion regions 135, 137 and 139.

It is noted that before the circuit edits shown in FIG. 1B were performed in integrated circuit die 125, diffusion 137 was coupled to diffusion 139 through metal interconnect 129. In addition, diffusion 135 was not coupled to diffusion 137. FIG. 1B shows circuit edits that have been performed to disconnect diffusion 137 from diffusion 139 and connect diffusion 135 to diffusion 137. As shown in FIG. 1B, diffusion 137 has been disconnected from diffusion 139 with metal interconnect 129 being physically cut by milling a hole 132 through the dielectric isolation layer 141 from the front side 145 of integrated circuit die 125. As shown in FIG. 1B, diffusion 137 has been disconnected from diffusion 139 as a result of hole 132. As shown in FIG. 1B, circuit edits have also been performed to connect diffusion 135 to diffusion 137. A hole 133 has been milled through dielectric isolation layer 141 from the front side 145 of integrated circuit die 125 to expose a portion of metal interconnect 128. Similarly, a hole 134 has been milled through dielectric isolation layer 141 from the front side 145 of integrated circuit die 125 to expose a portion of metal interconnect layer 129. A conductor 130 has then been deposited over the dielectric isolation layer 141 and holes 133 and 134 to connect metal interconnect 128 to metal interconnect 129, thereby connecting diffusion 135 to diffusion 137.

As mentioned above, it is noted that integrated circuit package 121 of FIG. 1B is of a wire bond design. There are several disadvantages associated with the wire bond design of integrated circuit package 121. One problem stems from the fact that as the density and complexity of integrated circuit die 125 increases, so must the number of wire bonds 123 required to control the functions integrated circuit die 125. However, there are only a finite number of wire bonds 123 that can fit along the periphery of integrated circuit die 125. One way to fit more wire bonds 125 along the periphery of integrated circuit die 125 is to increase the overall size of integrated circuit die 125, thereby increasing its peripheral area. Unfortunately, an increase in the overall size of integrated circuit die 125 also significantly increases the integrated circuit manufacturing costs.

Another disadvantage with integrated circuit package 121 of FIG. 1B is that the active circuitry within integrated circuit die 125 must be routed through metal interconnects 128 and 129 to the peripheral region of integrated circuit die 125 in order to electrically couple the active circuitry to wire bonds 123. By routing metal interconnect lines 128 and 129 over a relatively long distance across the integrated circuit die 125, the increased resistive, capacitive and inductive effects of these lengthy interconnect lines results in an overall speed reduction of the integrated circuit device. In addition, the inductance of wire bonds 123 may also severely limit high frequency operation of integrated circuit devices in integrated circuit package 121.

With continuing efforts in the integrated circuit industry to increase integrated circuit speeds as well device densities, there is a trend towards using flip-chip technology when packaging complex high speed integrated circuits. Flip-chip technology is also known as control collapse chip connection (C4) packaging. In flip-chip packaging technology, the integrated circuit die is flipped upside-down. This is opposite to how integrated circuits are packaged today using wire bond technology, as illustrated in FIG. 1B. By flipping the integrated circuit die upside-down, ball bonds may be used to provide direct electrical connections from the bond pads directly to the pins of a flip-chip package.

Figure 1C:
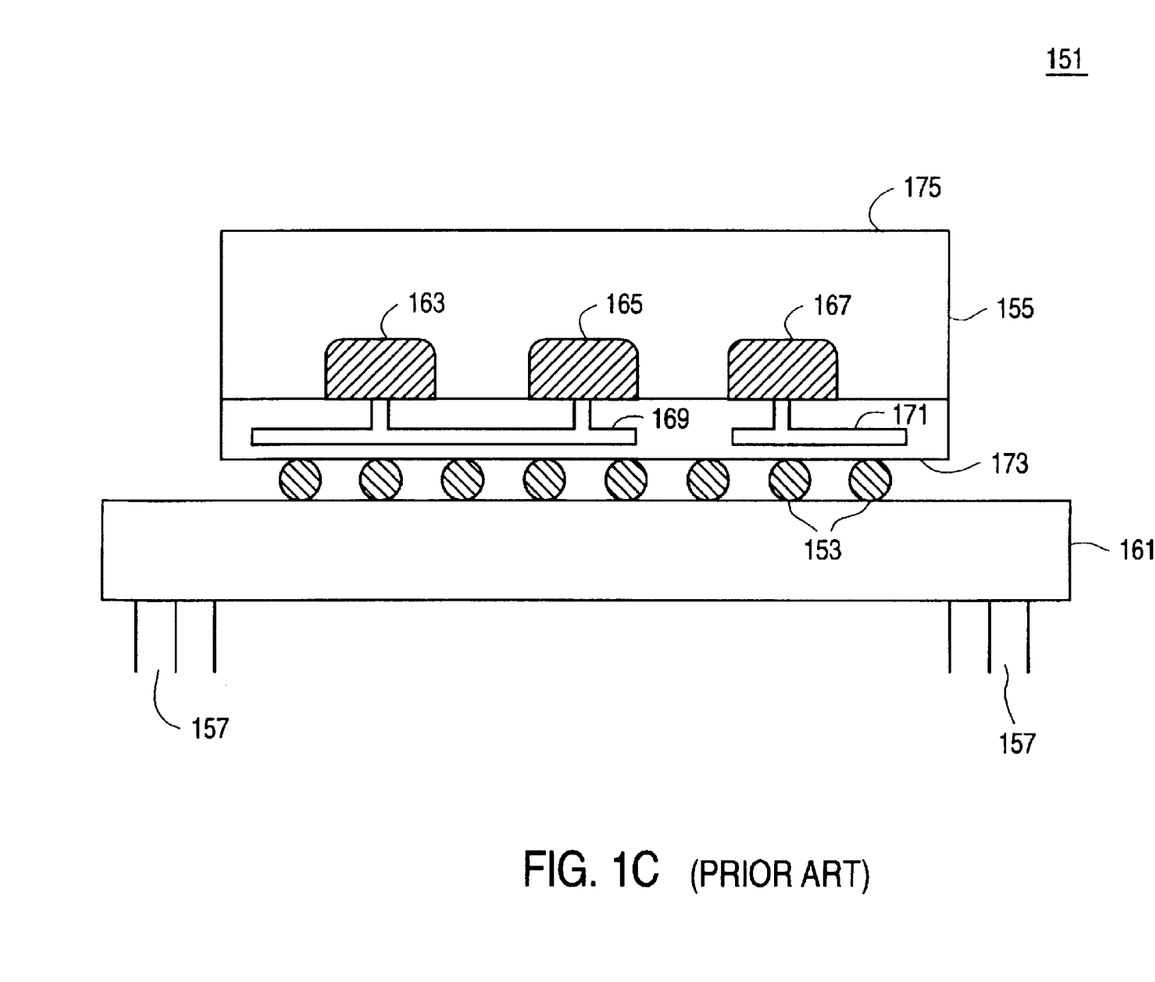
FIG. 1C is an illustration of a prior art cross-section of a flip-chip or C4 packaged integrated circuit die.

To illustrate, FIG. 1C shows a flip-chip package 151 with an integrated circuit die 155 flipped upside-down relative to wire bonded integrated circuit die 125 of FIG. 1B. In comparison with wire bonds 123 of FIG. 1B, ball bonds 153 of flip-chip package 151 provide more direct connections between the circuitry in integrated circuit die 155 and the pins 157 of package substrate 161 through metal interconnects 169 and 171. As a result, the inductance problems that plague the typical wire bond integrated circuit packaging technologies are reduced. Unlike wire bond technology, which only allows bonding along the periphery of the integrated circuit die 155, flip-chip technology allows connections to be placed anywhere on the integrated circuit die surface. This results in reduced inductance power distribution to the integrated circuit which is another major advantage of flip-chip technology.

One consequence of integrated circuit die 155 being flipped upside-down in flip-chip package 151 is that access to the internal nodes of integrated circuit die 155 for circuit edit purposes has become a considerable challenge. As illustrated in FIG. 1B, prior art circuit editing techniques used with wire bond technology are based on performing the circuit edits on metal interconnects 128 and 129 through the front side 145 of the integrated circuit die 125. However, with flip-chip packaging technology, this front side methodology is not feasible since the integrated circuit die is flipped upside-down. For example, as illustrated in FIG. 1C, circuit edit access to metal interconnects 169 and 171 through the front side 173 of integrated circuit die 155 is obstructed by package substrate 161. In addition, diffusion regions 163, 165 and 167 obstruct circuit edit access to metal interconnects 169 and 171 from the backside 175 of the semiconductor substrate of integrated circuit die 155.

Thus, what is desired is a method and apparatus enabling circuit edits to be performed in a flip-chip packaged integrated circuit through the backside of an integrated circuit die.

SUMMARY OF THE INVENTION

A method for making a circuit edit interconnect structure on an integrated circuit die is disclosed. In one embodiment, the method for performing a circuit edit in an integrated circuit die includes the steps of exposing from a backside of the integrated circuit die first and second circuit edit connection targets through a semiconductor substrate of the integrated circuit die, vapor depositing a polyimide layer over the semiconductor substrate of the integrated circuit die between the first and second circuit edit connection targets, and depositing a conductor over the polyimide layer between the first and second circuit edit connection targets to couple together the first and second circuit edit connection targets.

BRIEF DESCRIPTION OF THE DRAWINGS

The present invention is illustrated by way of example and not limitation in the accompanying figures.

DETAILED DESCRIPTION

A method and an apparatus for performing a circuit edit in an integrated circuit die is disclosed. In the following description, numerous specific details are set forth in order to provide a thorough understanding of the present invention. It will be apparent, however, to one having ordinary skill in the art that the specific detail need not be employed to practice the present invention. In other instances, well known materials or methods have not been described in detail in order to avoid obscuring the present invention. For the purposes of this discussion, a semiconductor substrate may be a substrate including any material or materials used in the manufacture of a semiconductor device.

The present invention is directed to a method and an apparatus that enables circuit edits to be performed on flip-chip packaged integrated circuit dies. As discussed earlier, prior art circuit edits are performed through the front side of integrated circuit die, but are not performed through the backside. With the continuing migration of packaging technology from wire bond technology to flip-chip technology, as illustrated in FIGS. 1B and 1C respectively, it is desired to develop the ability to perform circuit edits through the backside of the integrated circuit die.

Figure 2A:
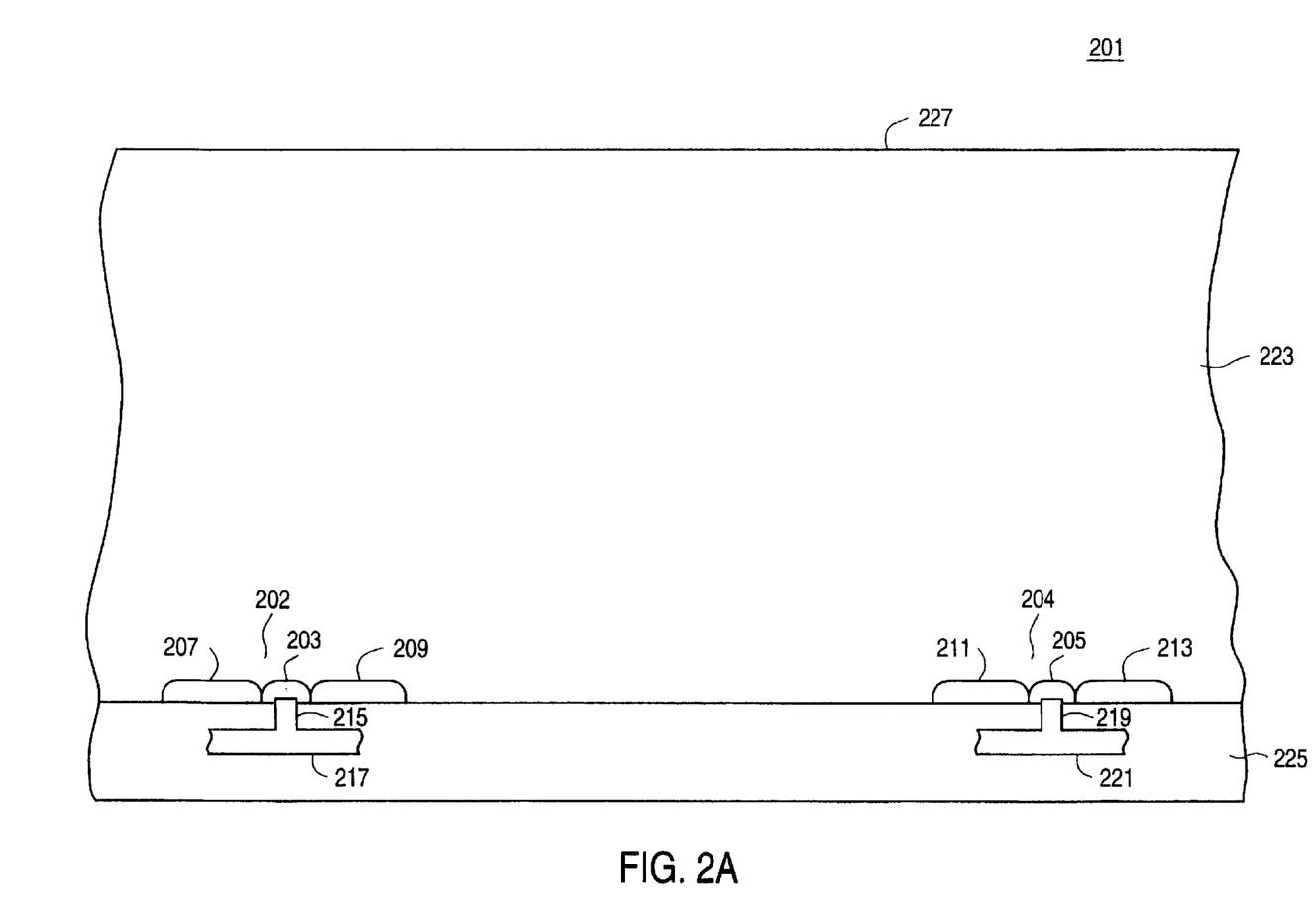
FIG. 2A is an illustration of a cross-section of a flip-chip packaged integrated circuit die including two unconnected circuit edit connection targets which are to be connected in accordance with the teachings of the present invention.

FIG. 2A is an illustration of a cross-section of a flip-chip packaged integrated circuit die 201, which includes two unconnected signal lines 217 and 221. As shown in the embodiment illustrated in 2A, signal lines 217 and 221 are disposed in a dielectric isolation layer 225 in integrated circuit die 201. In one embodiment, signal lines 217 and 221 are made of a conductive material, such as for example, metal, polysilicon, or the like. Signal line 217 is coupled to passive diffusion 203 through contact 215. Signal line 221 is coupled to passive diffusion 205 through contact 219. In one embodiment, connection target 202 includes passive diffusion 203 and contact 215, and connection target 204 includes passive diffusion 205 and contact 217. For the purposes of this disclosure, passive diffusion may be interpreted as a diffusion disposed in the semiconductor substrate for providing a signal access location. Passive diffusions 203 and 205 are disposed in the semiconductor substrate 223 of integrated circuit die 201. In one embodiment, semiconductor substrate 223 includes silicon. As shown in the embodiment illustrated in FIG. 2A, passive diffusion 203 is disposed in between field oxide or trench isolation oxide regions 207 and 209. Passive diffusion 205 is disposed between field oxide regions 211 and 213.

Assuming a circuit designer desires to perform a circuit edit on integrated circuit die 201 by coupling together signal lines 217 and 221, the following steps may be performed in accordance with the teachings of the present invention. In one embodiment, connection targets 202 and 204 are accessed through the backside 227 of flip-chip packaged integrated circuit die 201 to access signal lines 217 and 221 respectively. In another embodiment, signal lines 217 and 221 are accessed directly as circuit edit connection targets through the backside 227 of integrated circuit die 201. In general it is appreciated that any conductor in the integrated circuit die carrying a signal may be considered a connection target in accordance with the teachings of the present invention.

Figure 2B:
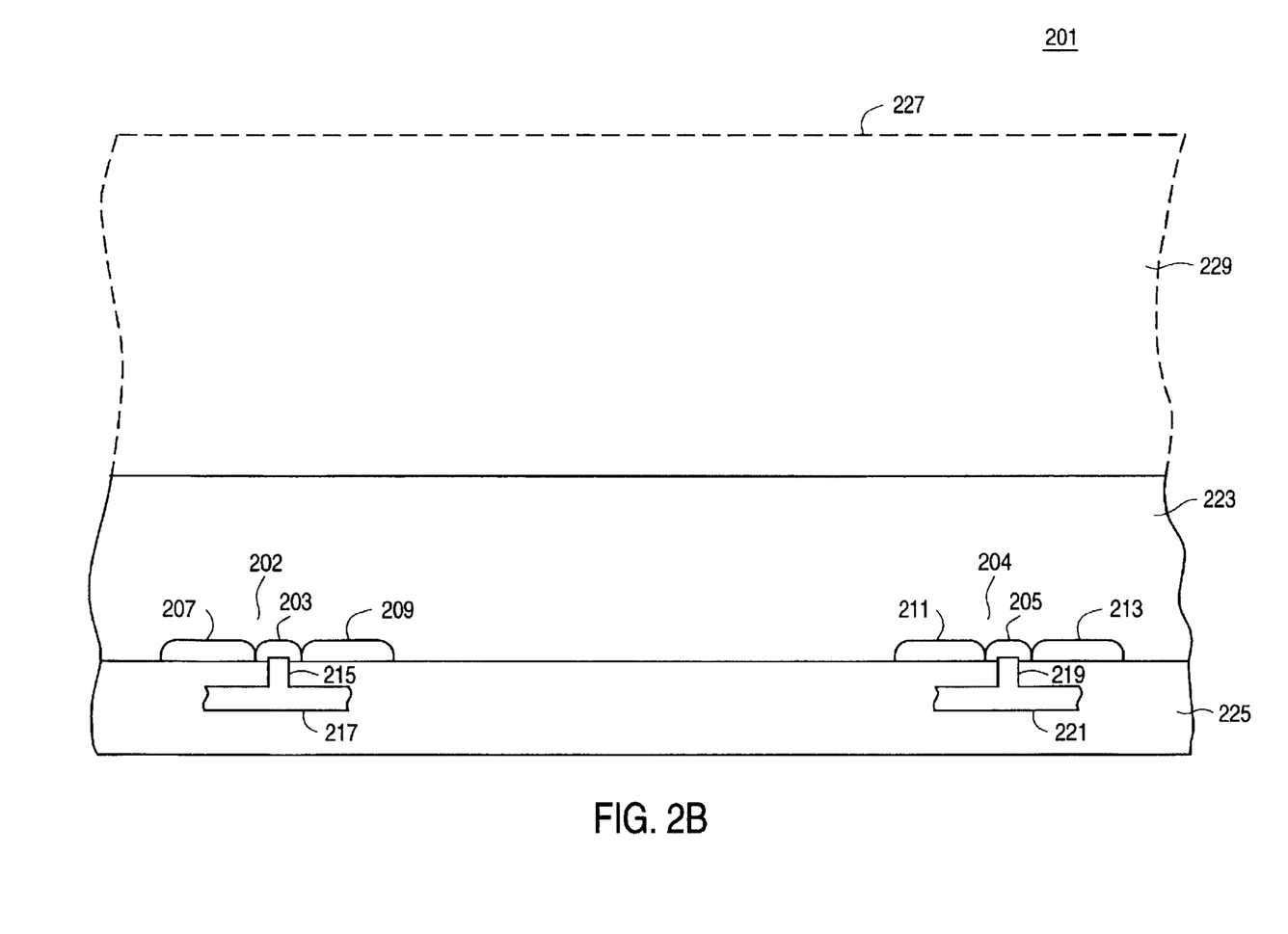
FIG. 2B is an illustration of a cross-section of a flip-chip packaged integrated circuit die that has been thinned from the backside in accordance with the teachings of the present invention.

In one embodiment, flip-chip packaged integrated circuit die 201 is first thinned in the regions above connection targets 202 and 204 when a circuit edit is to be performed in accordance with teachings of the present invention. This aspect of the present invention is illustrated in FIG. 2B with backside portion 229 of semiconductor substrate 223 being removed above connection targets 202 and 204 from backside 227. In one embodiment, integrated circuit die 201 is globally thinned to a thickness of approximately 200 microns using well known techniques such as for example but not limited to mechanical polishing, mechanical machining, chemical etching, or the like. In another embodiment, integrated circuit die 201 may be locally trenched in the regions proximate to connection targets 202 and 204 to remove backside portion 229 using well known techniques. In yet another embodiment, integrated circuit die 201 is thinned using a combination of well known global and local thinning techniques.

Figure 2C:
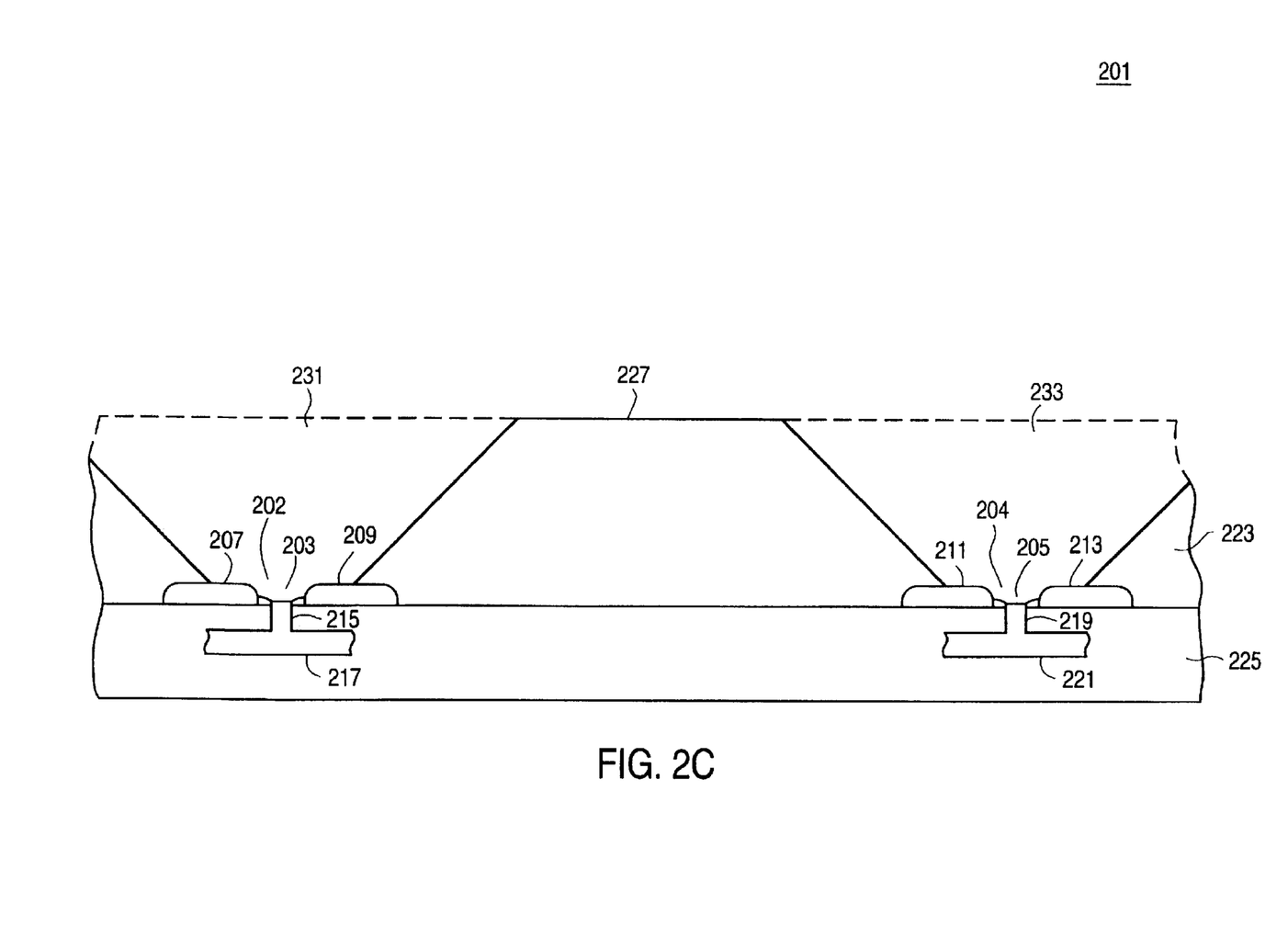
FIG. 2C is an illustration of a cross-section of an integrated circuit die with two circuit edit connection targets that have been exposed from the backside in accordance with the teachings of the present invention.

After the thinning step shown in FIG. 2B, a backside portion 231 of semiconductor substrate 223 above connection target 202 is milled away to expose passive diffusion 203 from the backside 227 of integrated circuit die 201, as shown in FIG. 2C. In addition, a backside portion 233 of semiconductor substrate 223 above connection target 204 is milled away to expose passive diffusion 205 from the backside 227 of integrated circuit die 201. In one embodiment, a portion of passive diffusions 203 and 205 are milled away and contacts 215 and 217 are directly exposed from backside 227. This aspect of the present invention is illustrated in FIG. 2C, which is a cross-section of integrated circuit die 201. In one embodiment, connection targets 202 and 204 are exposed using well known milling techniques, such as for example a focused ion beam milling tool.

In another embodiment, backside portions 231 and 233 of semiconductor substrate 223 are milled away from the backside 227 such that signal lines 217 and 221 are directly exposed as circuit edit connection targets through dielectric isolation layer 225 and semiconductor substrate 223. In this embodiment, passive diffusions 203 and 205 are not needed in order to provide circuit edit connection targets.

Figure 2D:
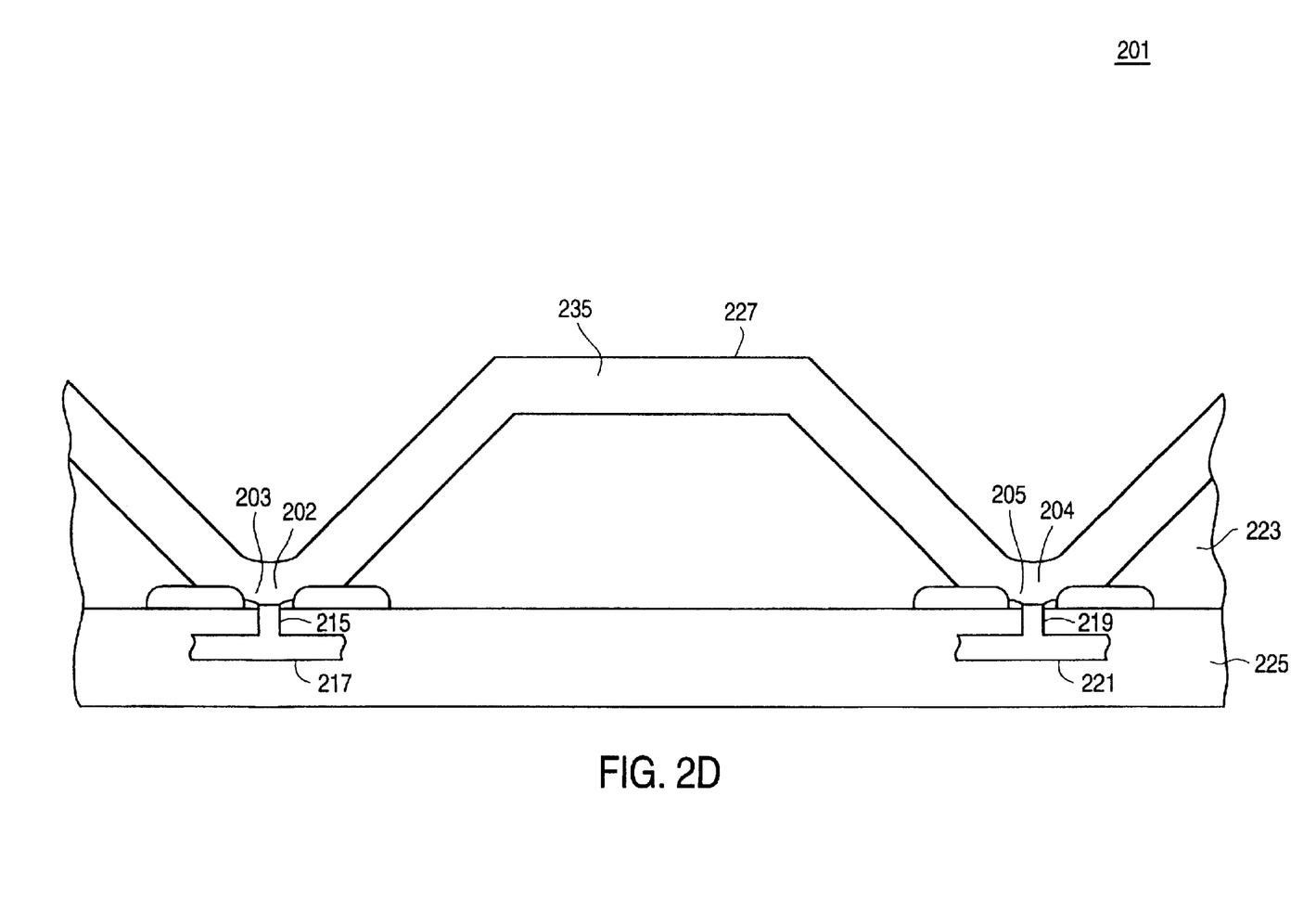
FIG. 2D is an illustration of a flip-chip packaged integrated circuit die that has been thinned and includes exposed circuit edit connection targets over which a polyimide layer has been deposited in accordance with the teachings of the present invention.
Figure 2E:
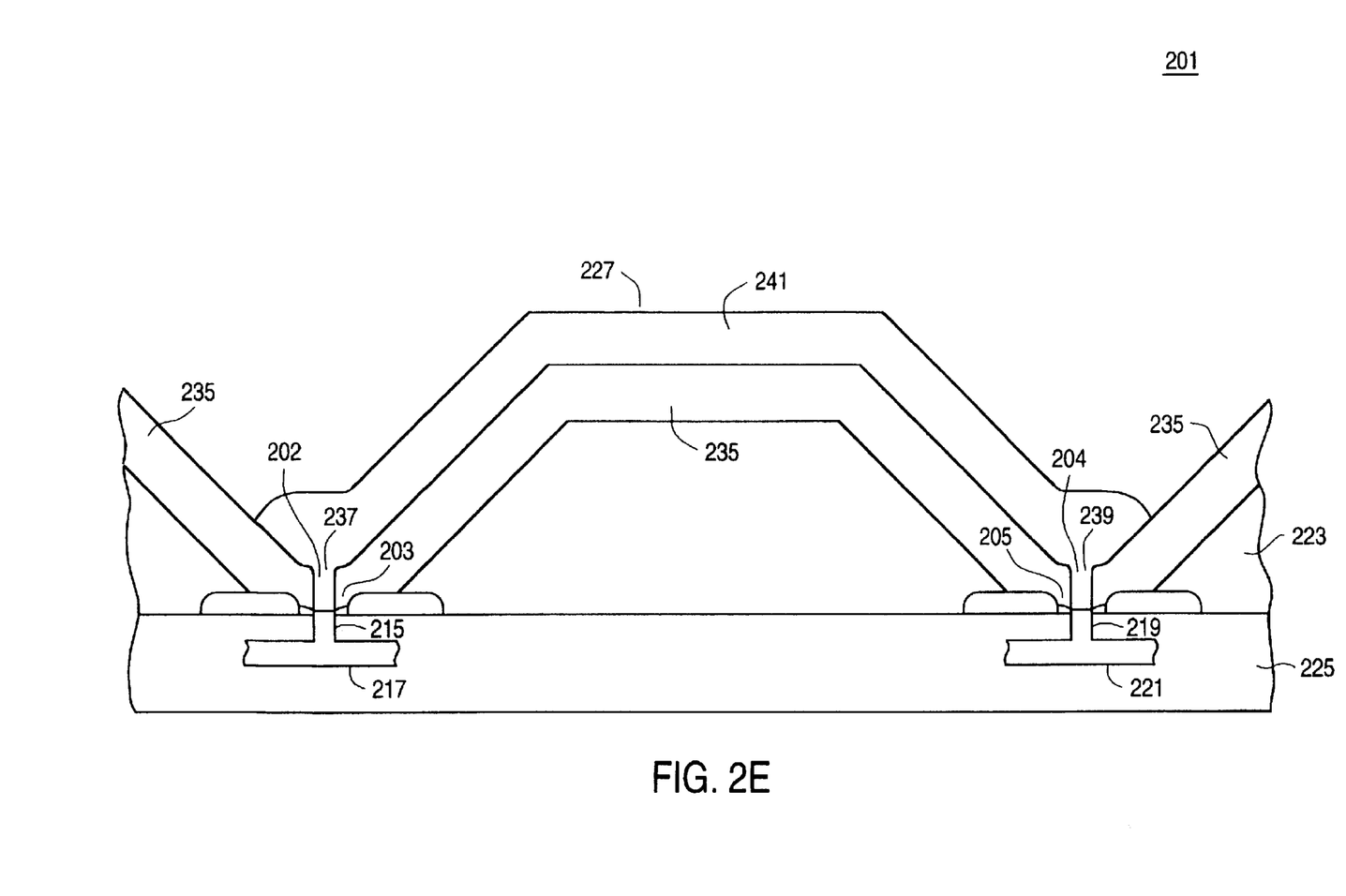
FIG. 2E is an illustration of a cross-section of a flip-chip packaged integrated circuit die with a conductor deposited between two circuit edit connection targets over the backside of the integrated circuit die in accordance with the teachings of the present invention.
Figure 2F:
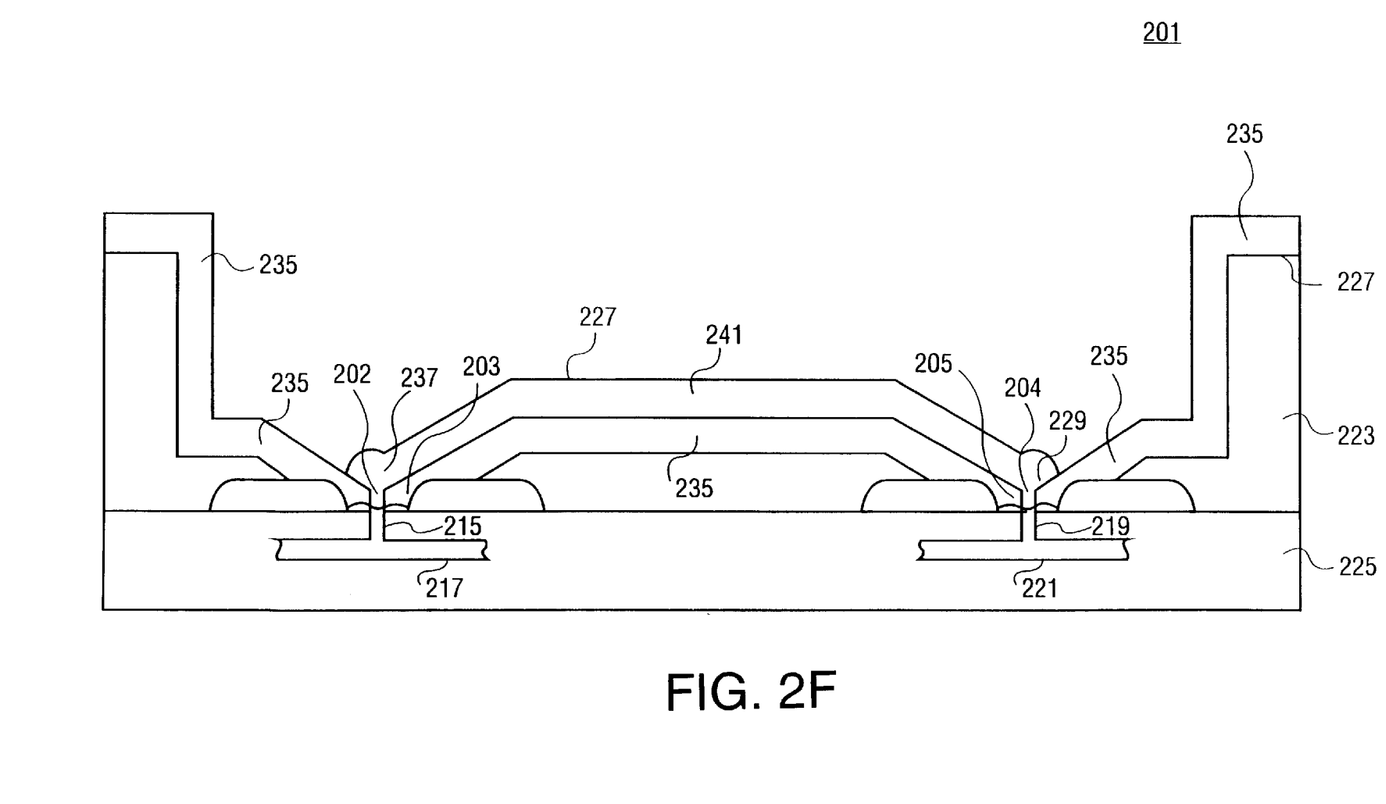
FIG. 2F is a full view of the flip-chip packaged integrated circuit die shown in FIG. 2E.

Once connection targets 202 and 204 have been exposed, a polyimide layer 235 is vapor deposited over the exposed circuit edit connection targets 202 and 204, and the adjacent exposed semiconductor substrate 223, as shown in FIGS. 2D through 2F. Polyimide layer 235 serves to provide electrical isolation between circuit edit connection targets 202 and 204 and the exposed areas of the semiconductor substrate 223. In addition, polyimide layer 235 also serves to provide an insulating platform that will be used to electrically isolate circuit edit connections, which will eventually be deposited over polyimide layer 235. Vapor depositing the polyimide over the exposed regions of the die ensures that the polyimide layer is deposited uniformly, with no voids and defects, over the entire exposed regions with, including the trench wall sections. Vapor depositing of the polyimide thus provides a conformal coating over the stepped topography of the trenched die. The interconnect metal lines exhibit good adhesion on polyimide as opposed to other types of insulation layers, such as silicon oxide.

In one embodiment, polyimide layer 235 is formed over the backside 227 of integrated circuit die 201 (see FIG. 2F) using well known techniques including but not limited to vapor deposition polymerization (VDP), which permits the formation of solventless films through vacuum coevaporation of a dianhydride and a diamine.

After polyimide layer 235 has been deposited, circuit edit connection targets are re-exposed from the backside 227 of integrated circuit die 201. As shown in the embodiment illustrated in FIG. 2E, an opening 237 is milled through polyimide layer 235 to re-expose connection target 202. An opening 239 is milled through polyimide layer 235 to re-expose connection target 204. In one embodiment, openings 237 and 239 are milled using a laser ablation technique. In yet another embodiment, openings 237 and 239 may be formed sing various well known lithography and etching techniques commonly used in integrated circuit fabrication. Note that that portion of the polyimide layer located beneath the interconnect lines is left intact during the laser ablation or etching process. The metal lines, in effect, act as a mask to prevent removal of the underlying polyimide. Since the polyimide under the metal interconnects is left intact it is ensured that the metal lines will not short with the exposed silicon substrate.

After the connection targets 202 and 204 have been exposed, and are isolated from the exposed bulk semiconductor substrate 223, a conductor 241 is deposited over the polyimide layer 235 and through openings 237 and 239 to couple connection targets 202 and 204 together. As illustrated in the embodiment shown in FIGS. 2E and 2F, connection target 202 is now coupled to connection target 204 through opening 237, conductor 241, and opening 239 to couple together signal line 217 and signal line 221. In one embodiment, conductor 241 is deposited using a FIB metal CVD, a laser metal CVD deposition tool, an electron beam deposition tool or the like. A salient feature of the present invention is that the process of depositing the conductor 241 causes that portion of the polyimide layer 235 under the conductor to be cured during the conductor deposition process. Curing is necessary to ensure that the polyimide layer 235 sufficiently adheres to the semiconductor substrate. Otherwise, delamination of the polyimide layer may occur resulting in an inoperable circuit edit structure.

Moreover, curing ensures that the polyimide layer 235 will possess stable dielectric properties and be pin-hole free. It is preferable that the conductor 241 be deposited at a temperature in the range of room temperature to 500° C. The temperature at which the conductor 241 is deposited is selected to induce curing of the polyimide layer located beneath the deposited conductor. The curing temperature will generally vary with the type of conductor deposition process used. When using a laser chemical vapor deposition process to deposit the conductor 241, the curing temperature profile will, in some instances, vary depending on the specific location of the polyimide layer 235. Conductor 241 is typically deposited to a thickness in the range of 0.3 to 1 microns, whereas the polyimide layer 235 is generally deposited to a thickness in the range of 0.15 to 5 microns. In one embodiment, conductor 241 includes a metal that is chemical vapor deposited based on tungsten, platinum, or other metallo-organics such as gold, copper, silver based compounds or the like. Thus, conductor 241 provides a circuit edit connection between signal line 217 and 221 from the backside 227 of integrated circuit die 201.

There are a number of optical-based applications that are used to debug flip-chip packaged integrated circuit die. One such method involves focusing a laser beam through the backside of the die onto an active region of the integrated circuit. The laser beam is reflected from the active region out the backside of the die where it is measured. The phase shift of the reflected beam is used to generate an output signal that is proportional to the charge modulation caused by the active region being probed. Other optical-based applications, such as optical-based imaging through silicon using an infrared laser scan microscope, thermal mapping, temperature probing, etc., can be used in the testing of integrated circuits by focusing a light source onto a portion of the circuit (e.g., a diffusion area, P-N junction, metal contact, metal interconnect, etc.) and monitoring the reflected light. For instance, thermal mapping or temperature probing may be accomplished by directing a laser beam onto a metal interconnect, or other portion of the integrated circuit, and detecting the index of refraction change due to temperature fluctuations in the integrated circuit. Another type of optical-based testing method involves the use of an infra-red camera that is positioned to detect photon emissions from the backside surface of the semiconductor substrate. The detection of backside photon emissions is useful in determining a variety of circuit related defects, such as, but not limited to, impact ionization, shorts, hot carrier effects, forward and reverse bias junctions, transistors in saturation, and gate oxide breakdown.

A problem associated with the use of optical-based techniques in the field of semiconductor testing arises due to the reflection of light at the surface of the semiconductor substrate. Reflection at the semiconductor surface weakens the intensity of the energy being emitted from the surface making it more difficult to detect the emitted photons. Reflection also limits the amount of returning laser power that is injected into the silicon substrate. Another advantage of the present invention is that the polyimide layer may also be used as an antireflective coating to minimize the reflection of energy at the backside of the semiconductor substrate. The vapor deposition of the polyimide layer permits a uniform anti-reflective layer to be deposited over the backside of the semiconductor substrate, thereby enhancing the use of optical-based techniques used in the debugging and testing of integrated circuits from the backside of a semiconductor substrate. For a typical two micron cured vapor deposited polyimide film, the average refractive index is 1.7, compared to a 1.9 refractive index for a silicon oxide film. The thickness of the polyimide layer is chosen to ensure that the reflectance curve for the layer is broad enough to be used for most, or all backside emission testing. For example, in one embodiment, the thickness of the polyimide layer 235 is approximately 1 to 2.5 microns.

Figure 2G:
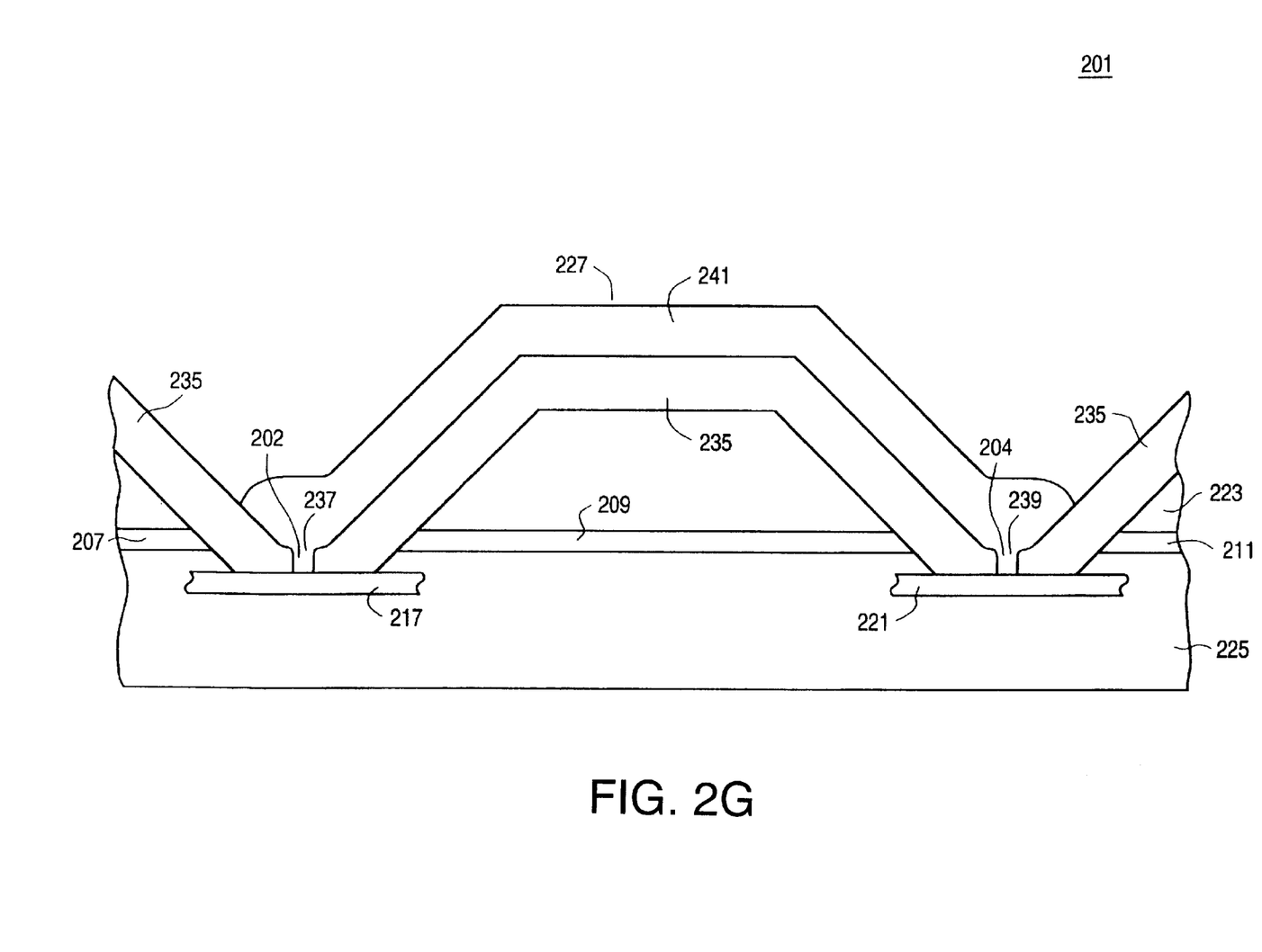
FIG. 2G is an illustration of alternate embodiment of a cross-section of a flip-chip packaged integrated circuit die with a conductor deposited in direct contact with circuit edit connection targets included in signal lines disposed in the dielectric isolation layer in accordance with the teachings of the present invention.

FIG. 2G is an illustration of alternate embodiment of a cross-section of a flip-chip packaged integrated circuit die 201 in which a circuit edit connection is formed with alternate connection targets in accordance with the teachings of the present invention. As shown in FIG. 2G, integrated circuit die 201 includes a signal lines 217 and 221 disposed in dielectric isolation layer 225 beneath field oxide regions 207, 209 and 211. In the embodiment illustrated, signal lines 217 and 221 are accessed directly from the backside 227 of integrated circuit die 201 through semiconductor substrate 223, field oxide regions 207, 209 and 211 and dielectric isolation layer 225. Using techniques similar to those discussed above in connection with FIGS. 2A–2E, integrated circuit die 201 is thinned and then signal lines 217 and 221 are directly exposed from the backside 227 at connection targets 202 and 204. A polyimide layer 235 is formed over exposed signal lines 217 and 221 and semiconductor substrate 223 and then openings 237 and 239 are formed in polyimide layer 235 to re-expose signal lines 217 and 221. Conductor 241 is then deposited over and between openings 237 and 239 over polyimide layer 235 to couple together signal lines 217 and 221 at connection targets 202 and 204.

Figure 3:
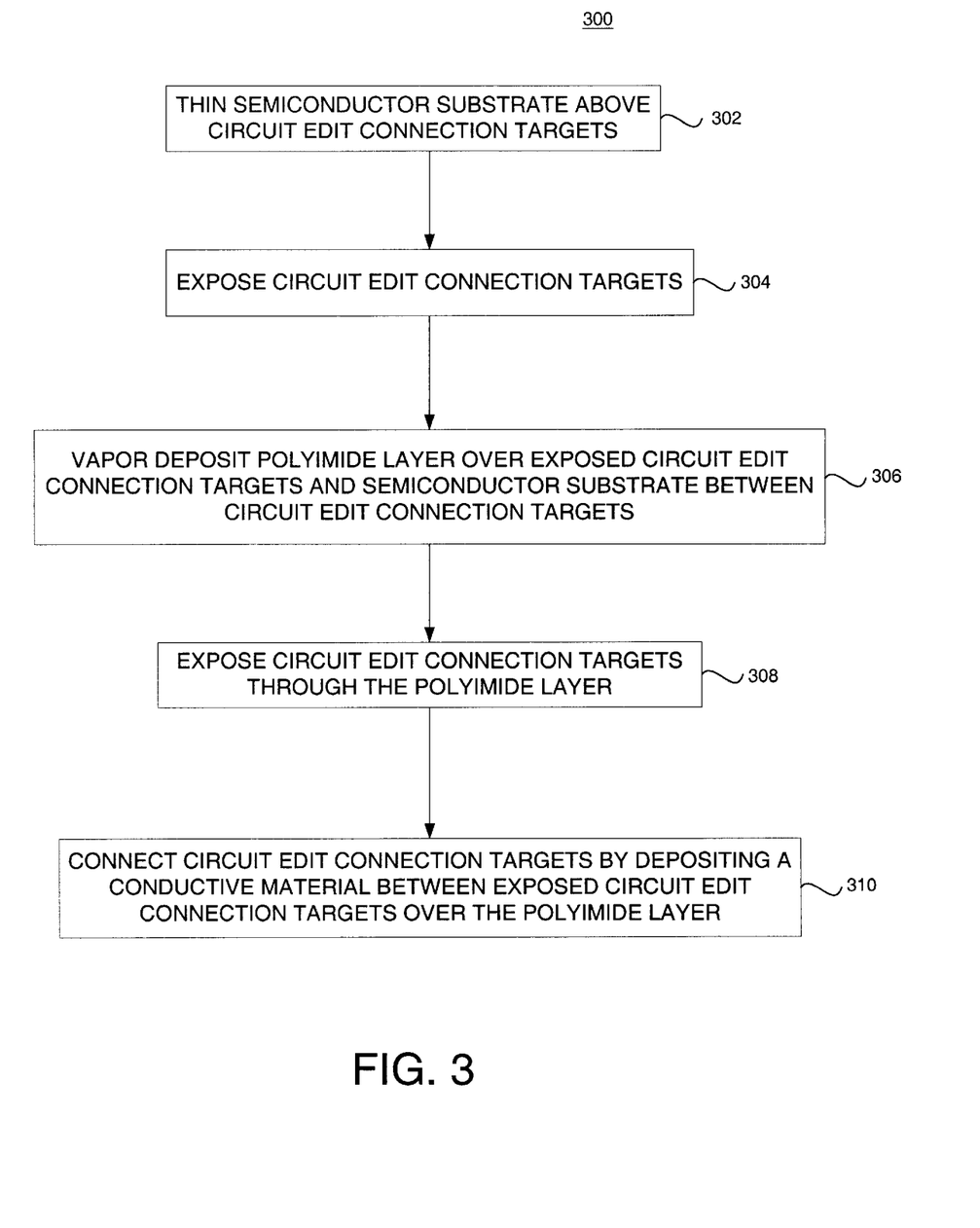
FIG. 3 is a flow chart diagram illustrating the circuit edit steps performed on a flip-chip packaged integrated circuit die in accordance with the teachings of the present invention.

Flow chart 300 of FIG. 3 shows circuit edit steps performed through the backside of an integrated circuit die in accordance with the teachings of the present invention. When adding a circuit edit connection between two circuit edit connection targets in an integrated circuit, flow chart 300 shows that the semiconductor substrate is first thinned above the circuit edit connection targets as shown in processing block 302. Next, the circuit edit connection targets are exposed according to processing block 304. Then a polyimide layer is deposited over the exposed circuit edit connection targets and the semiconductor substrate between the circuit edit connection targets as shown in processing block 306. Next, the circuit edit connection targets are exposed through the polyimide layer as shown in processing block 308. Afterwards, the circuit edit connection targets are connected by depositing conductive material between the exposed circuit edit connection targets over the polyimide layer as shown in processing block 310.

Thus, what has been described is a method and an apparatus for performing circuit edits through the backside of a flip-chip packaged integrated circuit die. In the foregoing detailed description, the method and apparatus of the present invention have been described with reference to specific exemplary embodiments thereof. It will, however, be evident that various modifications and changes may be made thereto without departing from the broader spirit and scope of the present invention. The present specification and Figures are accordingly to be regarded as illustrative rather than restrictive.

What is claimed is:

1. A method for performing a circuit edit in an integrated circuit die, the method comprising:

exposing from a backside of the integrated circuit die first and second circuit edit connection targets through a semiconductor substrate of the integrated circuit die by removing a backside portion of the semiconductor substrate above each of the first and second circuit edit connection targets;

vapor depositing a polyimide layer globally over the backside of the semiconductor substrate of the integrated circuit die using a vapor deposition polymerization process;

re-exposing the first and second circuit edit connection targets through the polyimide layer;

depositing a conductor over the polyimide layer between the first and second circuit edit connection targets to couple together the first and second circuit edit connection targets, wherein depositing the conductor is performed using a laser metal chemical vapor deposition system; and curing only a portion of the polyimide layer under the conductor simultaneously with depositing of the conductor.

2. The method of claim 1 wherein the polyimide layer is deposited to a thickness in the range of 0.15 to 5 microns.

3. The method of claim 1 wherein the conductor is deposited to a thickness in the range of 0.3 to 1 microns.

4. The method of claim 1 wherein the conductor is deposited onto the polyimide layer at a temperature in the range of room temperature to 500° C.

5. The method of claim 1 further compromising thinning the semiconductor substrate of the integrated circuit die from the backside of the integrated circuit die, the thinning performed before the exposing.

6. The method of claim 5 wherein the thinning includes:

globally thinning the semiconductor substrate of the backside of the integrated circuit die; and locally thinning the areas of the semiconductor substrate from the backside of the integrated circuit die proximate to and between the first and second circuit edit connection targets.

7. The method of claim 6 wherein globally thinning the backside of the integrated circuit die comprises the step of mechanically polishing the backside of the integrated circuit die to globally thin the integrated circuit die.

8. The method of claim 6 wherein locally thinning areas of the semiconductor substrate from the backside of the integrated circuit die proximate to and between the first and second circuit edit connection targets is performed with a laser chemical etching tool.

9. The method of claim 1 wherein globally depositing the polyimide layer is performed using a laser ablation system.

10. The method of claim 1 wherein depositing the conductor is performed using a focused ion beam metal chemical vapor deposition system.

11. The method of claim 1 wherein depositing the conductor is performed using an electron beam metal chemical vapor deposition system.

12. The method of claim 1 wherein the conductor masks the polyimide during re-exposing.

13. The method of claim 1 wherein the polyimide is deposited to a thickness to provide an anti-reflective coating on the backside of the integrated circuit die.

14. A method for performing a circuit edit in an integrated circuit die, the method comprising:

exposing from a backside of the integrated circuit die first and second circuit edit connection targets through a semiconductor substrate of the integrated circuit die by removing a backside portion of the semiconductor substrate above each of the first and second circuit edit connection targets;

depositing a polyimide layer over the semiconductor substrate of the integrated circuit die between the first and second circuit edit connection targets using a vapor deposition polymerization process;

laser chemical depositing a conductor over the polyimide layer between the first and second circuit edit connection targets to couple together the first and second circuit edit connection targets; and curing only a portion of the polyimide layer under the conductor simultaneously with depositing of the conductor.

15. The method of claim 14 wherein the conductor is deposited onto the polyimide layer at a temperature in the range of room temperature to 500° C.

16. The method of claim 14 further compromising thinning the semiconductor substrate of the integrated circuit die from the backside of the integrated circuit die, the thinning performed before the exposing.

17. The method of claim 16 wherein thinning includes:

globally thinning semiconductor substrate of the backside of the integrated circuit die; and locally thinning areas of the semiconductor substrate from the backside of the integrated circuit die proximate to and between the first and second circuit edit connection targets.

18. The method of claim 17 wherein globally thinning the backside of the integrated circuit die comprises the step of mechanically polishing the backside of the integrated circuit die to globally thin the integrated circuit die.

19. The method of claim 17 wherein locally thinning areas of the semiconductor substrate from the backside of the integrated circuit die proximate to and between the first and second circuit edit connection targets is performed with a laser chemical etching tool.

20. The method of claim 14 wherein depositing the polyimide layer over the semiconductor substrate includes:

globally depositing the polyimide layer over the backside of the integrated circuit die; and re-exposing the first and second circuit edit connection targets through the polyimide layer.

21. The method of claim 20 wherein the conductor masks a portion of the polyimide layer during re-exposing.

22. The method of claim 14 wherein the polyimide is deposited to a thickness to provide an anti-reflective coating on the backside of the integrated circuit die.

23. The method of claim 14 wherein the polyimide layer is deposited to a thickness in the range of 0.15 to 5 microns.

24. The method of claim 14 wherein the conductor is deposited to a thickness in the range of 0.3 to 1 micron.

25. The method of claim 14 wherein depositing the conductor is performed using a focused ion beam metal chemical vapor deposition system.

* * * * *